United States Patent
Kane

(10) Patent No.: US 8,178,482 B2
(45) Date of Patent: May 15, 2012

(54) CLEANING COMPOSITIONS FOR MICROELECTRONIC SUBSTRATES

(75) Inventor: Sean M. Kane, Bethlehem, PA (US)

(73) Assignee: Avantor Performance Materials, Inc., Phillipsburg, NJ (US)

(*) Notice: Subject to any disclaimer, the term of this patent is extended or adjusted under 35 U.S.C. 154(b) by 965 days.

(21) Appl. No.: 11/630,603

(22) PCT Filed: Jun. 23, 2005

(86) PCT No.: PCT/US2005/022598
§ 371 (c)(1),
(2), (4) Date: Dec. 20, 2006

(87) PCT Pub. No.: WO2006/023061
PCT Pub. Date: Mar. 2, 2006

(65) Prior Publication Data
US 2008/0051308 A1 Feb. 28, 2008

Related U.S. Application Data

(60) Provisional application No. 60/598,318, filed on Aug. 3, 2004.

(51) Int. Cl.
C11D 7/26 (2006.01)
C11D 7/32 (2006.01)
C11D 7/50 (2006.01)

(52) U.S. Cl. ........ 510/175; 510/245; 510/255; 510/258; 510/488; 510/493; 510/499; 510/505; 510/506; 134/1.3

(58) Field of Classification Search ............ 510/175, 510/245, 255, 258, 488, 493, 499, 505, 506; 134/1.2, 1.3
See application file for complete search history.

(56) References Cited

U.S. PATENT DOCUMENTS

| | | | |
|---|---|---|---|
| 5,597,678 A | 1/1997 | Honda et al. | |
| 5,612,304 A | 3/1997 | Honda et al. | |
| 5,780,406 A | 7/1998 | Honda et al. | |
| 5,795,702 A * | 8/1998 | Tanabe et al. | 430/331 |
| 5,798,323 A | 8/1998 | Honda et al. | |
| 5,989,353 A | 11/1999 | Skee et al. | |
| 6,110,881 A * | 8/2000 | Lee et al. | 510/175 |
| 6,191,086 B1 | 2/2001 | Leon et al. | |
| 6,245,155 B1 | 6/2001 | Leon et al. | |
| 6,268,323 B1 | 7/2001 | Honda et al. | |
| 6,274,296 B1 | 8/2001 | Chu | |
| 6,276,372 B1 | 8/2001 | Lee | |
| 6,372,050 B2 | 4/2002 | Honda et al. | |
| 6,379,875 B2 | 4/2002 | Chu | |
| 6,447,563 B1 | 9/2002 | Mahulikar | |
| 6,468,913 B1 | 10/2002 | Pasqualoni et al. | |
| 6,524,376 B2 | 2/2003 | Aoki et al. | |
| 6,546,939 B1 | 4/2003 | Small | |
| 6,638,899 B1 | 10/2003 | Wakiya et al. | |
| 6,660,460 B2 | 12/2003 | Sahbari | |
| 2001/0006936 A1 * | 7/2001 | Lee et al. | 510/175 |
| 2003/0064671 A1 | 4/2003 | Pasqualoni et al. | |
| 2003/0100459 A1 * | 5/2003 | Yoon et al. | 510/175 |
| 2003/0104770 A1 | 6/2003 | Pasqualoni et al. | |
| 2003/0228990 A1 | 12/2003 | Lee | |
| 2004/0018949 A1 * | 1/2004 | Lee | 510/175 |
| 2004/0067860 A1 | 4/2004 | Lee et al. | |
| 2004/0081922 A1 * | 4/2004 | Ikemoto et al. | 430/329 |
| 2004/0108302 A1 | 6/2004 | Liu et al. | |

FOREIGN PATENT DOCUMENTS
WO WO03/003124 * 1/2003

* cited by examiner

Primary Examiner — Gregory DelCotto
(74) Attorney, Agent, or Firm — Hoffmann & Baron, LLP

(57) ABSTRACT

A stripping and cleaning composition for cleaning microelectronics substrates, the composition comprising: at least one organic stripping solvent, at least one nucleophilic amine, at least one non-nitrogen containing weak acid in an amount sufficient to neutralize from about 3% to about 75% by weight of the nucleophilic amine such that the stripping composition has an aqueous pH of from about 9.6 to about 10.9, said weak acid having a pK value in aqueous solution of 2.0 or greater and an equivalent weight of less than 140, at least one metal-removing compound selected from the group consisting of diethylene glycol and diethylene glycolamine, and water, and method for cleaning microelectronic substrates with these compositions.

6 Claims, No Drawings

CLEANING COMPOSITIONS FOR MICROELECTRONIC SUBSTRATES

CROSS REFERENCE TO RELATED APPLICATIONS

This application is a national stage application of PCT/US2005/022598, filed 23 Jun. 2005, which claims the benefit of U.S. Provisional Application No. 60/598,318 filed 3 Aug. 2004.

FIELD OF THE INVENTION

This invention pertains to cleaning and stripping compositions for microelectronic substrates and particularly for cleaning metal-containing residues from aluminum-containing microelectronics components without causing undue aluminum corrosion. The invention also relates to cleaning of vias that punch through metal layers of microelectronics components, such as titanium or titanium nitride layers, while being compatible with underlying aluminum structures, i.e., causing little or no metal corrosion in the microelectronics components. The invention further relates to such cleaning compositions that also are able to clean post-ash residue from other vias and from metal lines as well as cleaning or stripping unashed photoresist from microelectronics substrates. A further aspect of this invention is a process of cleaning or stripping photoresist and residue from aluminum-containing microelectronics components without causing undue aluminum corrosion.

BACKGROUND TO THE INVENTION

During the manufacture of microelectronic devices photoresists are employed to transfer images to a microelectronics substrate to create the desired circuit layer. Many of the microelectronic devices are metallized with aluminum. Also, the microelectronics substrate may employ metals such as titanium, titanium nitride, tungsten and the like as adhesion promoters and diffusion barriers.

Many alkaline microelectronic stripping and cleaning compositions have been proposed for the removal of cross-linked and hardened photoresists and other residues, such as post etch residues, from such microelectronic substrates. However, one problem with such stripping and cleaning composition is the possibility of metal corrosion occurring as a result of the use of such cleaning compositions. Such corrosion results in whiskers, pitting, notching of metal lines, due at least in part to the reaction of the metals in the device substrates with the alkaline strippers employed. One such alkaline microelectronic stripping and cleaning composition is that disclosed in U.S. Pat. No. 5,308,745. While the stripping and cleaning compositions of that patent have been commercially employed to strip hardened and cross-linked photoresist from substrates, it has been discovered that attempts to clean microelectronic substrates having aluminum metallization and containing residues of metals from layers such as layers of titanium, titanium nitride, tungsten and the like, with the cleaning composition of this patent has resulted in significant aluminum corrosion or insufficient cleaning of the metal residues. Therefore, there is a limitation on the use of the cleaning compositions of that patent in the cleaning of vias that punch-through underlying layers of titanium, titanium nitride, tungsten and the like.

There is therefore a need for microelectronic stripping and cleaning compositions that can effectively remove such metal residues and do so without any significant aluminum corrosion resulting from the stripping and cleaning composition. There is also a need for stripping and cleaning compositions that, in addition to cleaning these metal residues, will also effectively clean post-ash residues from other vias and from metal lines, as well as cleaning unashed photoresist residue from the substrate.

BRIEF SUMMARY OF THE INVENTION

In accordance with this invention, there are provided stripping and cleaning compositions for cleaning microelectronics substrates, the composition comprising: at least one organic stripping solvent, at least one nucleophilic amine, at least one non-nitrogen containing weak acid in an amount sufficient to neutralize from about 3% to about 75%, preferably from about, 19% to about 75%, by weight of the nucleophilic amine such that the stripping composition has an aqueous pH of from about 9.6 to about 10.9, said weak acid having a pK value in aqueous solution of 2.0 or greater and an equivalent weight of less than 140, at least one metal-removing compound selected from the group consisting of diethylene glycol and diethylene glycolamine, and water, and methods for cleaning microelectronic substrates with these compositions.

The stripping and cleaning composition of this invention for cleaning microelectronics substrates comprise:
  a) at least one organic stripping solvent,
  b) at least one nucleophilic amine,
  c) at least one non-nitrogen containing weak acid in an amount sufficient to neutralize from about 3% to about 75%, preferably from about 19% to about 75%, by weight of the nucleophilic amine such that the stripping composition has an aqueous pH of from about 9.6 to about 10.9, said weak acid having a pK value in aqueous solution of 2.0 or greater and an equivalent weight of less than 140,
  d) at least one metal-removing compound selected from the group consisting of diethylene glycol and diethylene glycolamine, and
  e) water.

The compositions may additionally comprise one or more components such as metal-complexing/corrosion resisting compounds, other corrosion inhibitors and surfactants.

The method for cleaning microelectronic substrates according to this invention comprises a method for cleaning microelectronic substrates without producing any substantial metal corrosion, the substrate containing at least one photoresist polymeric material, etch residues and metal residues, the process comprising contacting the substrate with a cleaning composition for a time sufficient to clean the substrate, wherein the cleaning composition comprises:
  a) at least one organic stripping solvent,
  b) at least one nucleophilic amine,
  c) at least one non-nitrogen containing weak acid in an amount sufficient to neutralize from about 3% to about 75%, preferably from about 19% to about 75%, by weight of the nucleophilic amine such that the stripping composition has an aqueous pH of from about 9.6 to about 10.9, said weak acid having a pK value in aqueous solution of 2.0 or greater and an equivalent weight of less than 140,
  d) at least one metal-removing compound selected from the group consisting of diethylene glycol and diethylene glycolamine, and
  e) water.

The compositions used in the methods of this invention may additionally comprise one or more components such as metal-complexing/corrosion resisting compounds, other corrosion inhibitors and surfactants. The method of cleaning microelectronic substrates in accordance with this invention is particularly useful for cleaning substrate that comprises an aluminum metallized substrate having vias and containing metal residue from at least one of layers of titanium and/or titanium nitride.

DETAILED DESCRIPTION OF THE INVENTION AND PREFERRED EMBODIMENTS

This invention provides stripping and cleaning compositions for cleaning microelectronics substrates, the composition comprising: at least one organic stripping solvent, at least one nucleophilic amine, at least one non-nitrogen containing weak acid in an amount sufficient to neutralize from about 3% to about 75%, preferably from about 19% to about 75%, by weight of the nucleophilic amine such that the stripping composition has an aqueous pH of from about 9.6 to about 10.9, said weak acid having a pK value in aqueous solution of 2.0 or greater and an equivalent weight of less than 140, at least one metal-removing compound selected from the group consisting of diethylene glycol and diethylene glycolamine, and water, and methods for cleaning microelectronic substrates with these compositions.

The stripping and cleaning composition of this invention for cleaning microelectronics substrates comprise:
  a) at least one organic stripping solvent,
  b) at least one nucleophilic amine,
  c) at least one non-nitrogen containing weak acid in an amount sufficient to neutralize from about 3% to about 75%, preferably from about 19% to about 75%, by weight of the nucleophilic amine such that the stripping composition has an aqueous pH of from about 9.6 to about 10.9, said weak acid having a pK value in aqueous solution of 2.0 or greater and an equivalent weight of less than 140,
  d) at least one metal-removing compound selected from the group consisting of diethylene glycol and diethylene glycolamine, and
  e) water.

The compositions may additionally comprise one or more components such as metal-complexing/corrosion resisting compounds, other corrosion inhibitors and surfactants.

The at least one organic stripping solvent will generally be present in the composition in an amount of from about 20 to about 80 wt %, preferably in an amount of from about 30 to about 75 wt %, and more preferably in an amount of from about 40 to about 60 wt %. The organic stripping solvent will generally be one having a solubility parameter of from about 8 to about 15, obtained by taking the square root of the sum of the three Hansen solubility parameters (dispersive, polar and hydrogen bonding). The solvent system may comprise one or more such solvents. Suitable solvents include, but are not limited to, 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, 1-hydroxypropyl-2-pyrrolidinone, and the like, diethylene glycol monoalkyl ethers such as those of the formula HO—$CH_2$—$CH_2$—O—$CH_2$—$CH_2$—O—R where R is an alkyl radical of from 1 to 4 carbon atoms, compounds containing sulfur oxides such as dialkyl sulfones of the formula $R^1$—S(O)(O)—$R^2$ where $R^1$ and $R^2$ are alkyl of 1 to 4 carbon atoms, dimethyl sulfoxide (DMSO), tetrahydrothiophene-1,1-dioxide compounds such as sulfolane, methyl sulfolane and alkyl sulfolanes, dimethylacetamide and dimethylformamide. Preferably the solvent is N-methyl pyrrolidone.

The at least one nucleophilic amine components of the compositions of this invention will generally be present in the compositions in an amount of from about 1 to about 50 wt %, preferably from about 10 to about 45 wt %, and more preferably from about 20 to about 30 wt %. Alkaline stripper components that may be used in this invention also cover a wide range of structural types. Their dissociation constants, expressed as pK values, will generally range from about 9 to about 11 for the beta-oxygen or -nitrogen substituted amines to about 8.3 for the secondary amine, morpholine and hydroxylamines and hydroxylamine derivatives of somewhat lower pK values. Among the alkaline components that may be used there may be mentioned, nucleophilic amines, preferably for example, alkanolamines, and particularly monoethanolamine, 1-amino-2-propanol, 2-(2-aminoethoxy)ethanol, 2-aminoethanol, 2-(2-aminoethylamino)ethanol, 2-(2-aminoethylamino)ethylamine and the like. More important than the actual pK value of an amine is its nucleophilicity which should be high. Most preferably the nucleophilic amine is monoethanolamine or 1-amino-2-propoanol.

The non-nitrogen-containing weak acids component of the compositions of this invention will generally be present in the composition in an amount of from about 0.5 to about 10 wt %, preferably from about 1 to about 8 wt %, and more preferably from about 2 to about 6 wt %. The non-nitrogen containing weak acids that may be employed in this invention include organics such as carboxylic acids or phenols as well as salts of inorganic acids such as carbonic or hydrofluoric acid. By weak acids is meant acids having a strength expressed as a "pK" for the dissociation constant in aqueous solution of at least 2.0 or higher, preferably 2.5 or higher. Particularly useful are weak acids of pK>2.0 and preferably having an equivalent weight of less than about 140. As examples of such non-nitrogen containing weak acids useful in this invention there may be mentioned, for example, carboxylic acids such as acetic acid, phthalic acid, phenoxyacetic acid and the like, organic acids such as 2-mercaptobenzoic acid, 2-mercaptoethanol and the like, phenols generally having pK in the range of from 9 to 10, such as phenol, catechol, 1,3,5-trihydroxybenzene, pyrogallol, resorcinol, 4-tert-butylcatechol and the like, and inorganic acids such as carbonic acid, hydrofluoric acid and the like. The amount of weak acid employed in the stripping compositions of this invention is an amount to neutralize from about 3% to about 75%, preferably from about 19% to about 75%, by weight of the amine present in the stripper composition thereby resulting in an aqueous rinse pH for said stripper compositions of from about pH 9.6 to about 10.9. Most preferably the weak acid is catechol.

The at least one metal-removing component is diethylene glycol or diethylene glycolamine or mixtures thereof. This component is generally present in the composition in an amount of from about 0.5 to about 40 wt %, preferably from about 1 to about 20 wt %, and more preferably from about 5 to about 15 wt %. This component is preferably diethylene glycol.

The cleaning and stripping compositions of this invention are alkaline aqueous compositions and water is present generally in an amount of from about 0.5 to about 50 wt %, preferably from about 1 to about 35 wt %, and more preferably from about 5 to about 20 wt %.

The compositions of this invention may also optionally contain other additional components. Such optional additional components include metal-complexing/corrosion resisting compounds, other corrosion inhibitors and surfactants.

Organic or inorganic chelating or metal complexing agents/corrosion inhibitors are not required, but may optionally be included in the compositions of this invention, but offer substantial benefits, such as for example, improved product stability when incorporated into the aqueous cleaning compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e,g. ethylenediamine tetra(methylene phosphonic acid) (EDTMP), diethylenetriamine penta(methylene phosphonic acid), triethylenetetramine hexa(methylene phosphonic acid). The chelating agent will be present in the composition in an amount of from 0 to about 5 wt %, preferably from about 0.1 to about 2 wt % based on the weight of the composition.

The aqueous cleaning compositions of this invention can also optionally contain other corrosion inhibitors and similar non-corrosive components employed in microelectronic cleaner compositions. The compounds may include resorcinol, gallic acid, propyl gallate, pyrogallol, hydroquinone, benzotriazole and derivatives of benzotriazole, and polyfunctional carboxylic acids such as citric acid, tartaric acid, gluconic acid, saccharic acid, glyceric acid, oxalic acid, phthalic acid, maleic acid, mandelic acid, malonic acid, lactic acid, and salicylic acid. These other corrosion inhibitors may be present in any suitable amount, generally in an amount of from about 0 to about 5 wt %, preferably from about 0.1 to about 3 wt %, and more preferably from about 0.2 to about 2 wt %.

The compositions of the present invention may also optionally contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired. Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof. Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics. Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, poiyoxyethylene diols, siloxane type surfactants, and alkylene glycol monoalkyl ethers. Preferably, the non-ionic surfactants are acetylenic diols or ethoxylated acetylenic diols. Anionic surfactants useful in the compositions of the present invention include carboxylates, N-acylsarcosinates, sulfonates, sulfates, and mono and diesters of orthophosphoric acid such as decyl phosphate. Preferably, the anionic surfactants are metal-free surfactants. Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants. Example of especially suitable surfactants include, but are not limited to 3,5-dimethyl-1-hexyn-3-ol (Surfynol-61), ethoxylated 2,4,7,9-tetramethyl-5-decyne-4,7-diol (Surfynol-465), polytetrafluoroethylene cetoxypropylbetaine (Zonyl FSK), Zonyl FSH, Triton X-100, namely octylphenoxypolyethoxyethanol, and the like. The surfactant will generally be present in an amount of from 0 to about 5 wt %, preferably 0.001 to about 3 wt % based on the weight of the composition.

Example of cleaning compositions of this invention include, but are not limited to, the compositions set forth in the following Tables 1, 2, 3 and 4. In Tables 1, 2, 3 and 4, as well as in following Tables 5 through 9, the abbreviations employed are as follows:

NMP=N-methyl pyrrolidinone
DMSO=dimethyl sulfoxide
DMAC=dimethyacetamide
DMF=dimethformamide
DEG=diethylene glycol
DEGA=diethylene glycolamine
CAT=catechol
MEA=monoethanolamine
AMP=1-amino-2-propanol

TABLE 1

Compositions/Parts by Weight

| Components | 1 | 2 | 3 | 4 | 5 |
|---|---|---|---|---|---|
| NMP | 46 | 26 | 26 | 26 | 26 |
| DMSO | | | | | |
| DMAC | | | | | |
| MEA | 23 | 20 | 20 | 10 | 10 |
| AMP | | | | | |
| DEG | 11 | 8 | | | |
| DEGA | | | 8 | 2 | 8 |
| CAT | 5 | 1 | 1 | 1 | 5 |
| WATER | 15 | 4 | 4 | 4 | 4 |

TABLE 2

Compositions/Parts by Weight

| Components | 6 | 7 | 8 | 9 | 10 |
|---|---|---|---|---|---|
| NMP | 26 | 26 | 26 | 26 | 26 |
| DMSO | | | | | |
| DMAC | | | | | |
| MEA | 20 | 20 | 15 | 15 | 15 |
| AMP | | | | | |
| DEG | | | | | 5 |
| DEGA | 2 | 8 | 5 | 5 | |
| CAT | 5 | 5 | 3 | 1 | 3 |
| WATER | 4 | 10 | 7 | 7 | 4 |

TABLE 3

Compositions/Parts by Weight

| Components | 11 | 12 | 13 | 14 | 15 |
|---|---|---|---|---|---|
| NMP | 46 | 46 | 54 | 46 | |
| DMSO | | | | | |

TABLE 3-continued

Compositions/Parts by Weight

| Components | 11 | 12 | 13 | 14 | 15 |
|---|---|---|---|---|---|
| DMAC |  |  |  |  | 46 |
| MEA | 21 | 25 | 21 |  |  |
| AMP |  |  |  | 23 | 23 |
| DEG | 13 | 9 |  | 11 | 11 |
| DEGA |  |  | 9 |  |  |
| CAT | 7 | 3 | 3 | 5 | 5 |
| WATER | 13 | 17 | 13 | 15 | 15 |

TABLE 4

Compositions/Parts by Weight

| Components | 16 |
|---|---|
| NMP |  |
| DMSO | 46 |
| DMAC |  |
| MEA | 23 |
| AMP |  |
| DEG | 11 |
| DEGA |  |
| CAT | 5 |
| WATER | 15 |

The outstanding performance cleaning and non-corrosive properties of the cleaning compositions of this invention compared to similar compositions with other polyhyroxyl compounds instead of DEG and DEGA is demonstrated by the following cleaning Examples 1 to 11. Several cleaning compositions were prepared by mixing 26 g of NMP, 20 g of monoethanolamine, 1 g of catechol, 4 g of DI water, and 8 g of a cleaning compound from the following: diethylene glycol (DEG), diethylene glycolamine (DEGA), triethylene glycol, tetraethylene glycol, ethylene glycol propylene glycol, N-methylethanolamine, 2-(2-aminoethylamino)ethanol, 2-butene-1,4-diol and 2-(2-methoxyethoxy)ethanol. Patterned Al technology wafer samples with "punch-through" via structures (vias etch through Si and TiN to an Al layer) were placed in these solutions of heated to 85° C. for 20 minutes after which they were removed, rinsed in DI water for two minutes and blown dry with nitrogen. For comparison, the same wafers were cleaned in a commercially available stripping composition of U.S. Pat. No. 5,308,745 (containing NMP, sulfolane, MEA, catechol and DI water). The cleaned wafers were then evaluated for ash residue removal (0=no removal to 10=100% removal) and aluminum corrosion (0=no corrosion to 10=corrosion), as noted below in Table 5

TABLE 5

| Example # | Cleaning compound | Aluminum corrosion | Ash residue removal |
|---|---|---|---|
| 1 | diethylene glycol | 0 | 10 |
| 2 | diethylene glycolamine | 1 | 8 |
| 3 | tetraethylene glycol | 0 | 5 |
| 4 | 2-butene-1,4-diol | 0 | 5 |
| 5 | ethylene glycol | 0 | 4 |
| 6 | propylene glycol | 0 | 4 |
| 7 | N,N-dimethylethanolamine | 1 | 4 |
| 8 | 2-(2-aminoethylamino)ethanol | 2 | 2 |
| 9 | 2-(2-methoxyethoxy)ethanol | 0 | 2 |
| 10 | triethylene glycol | 0 | 1 |
| 11 | Commercial product of U.S. Pat. No. 5,308,745 | 0 | 1 |

Only DEG and DEGA provide both excellent ash residue removal and aluminum corrosion inhibition. The usefulness of the cleaning compositions of this invention under a variety of cleaning conditions of time and temperature and with varying formulations is exemplified in the following Examples 12 to 29.

EXAMPLES 12 TO 16

Several cleaning compositions were prepared by mixing 1-methyl-2-pyrrolidinone (NMP), monoethanolamine (MEA), diethylene glycolamine (DEGA), catechol (CAT), and DI water in the amounts shown below. The same type of patterned Al technology wafer samples with "punch-through" vias as employed in Examples 1 to 11 were placed in these solutions of heated to 85° C. for 20 minutes after which they were removed, rinsed in DI water for two minutes and blown dry with nitrogen. The cleaned wafers were then evaluated for ash residue removal (0=no removal to 10=100% removal) and aluminum corrosion (0=no corrosion to 10=severe corrosion), as noted in Table 6.

TABLE 6

| Example # | NMP | MEA | DEGA | Catechol | $H_2O$ | Aluminum corrosion | Ash residue removal |
|---|---|---|---|---|---|---|---|
| 12 | 26 | 10 | 2 | 1 | 4 | 0 | 10 |
| 13 | 26 | 10 | 8 | 5 | 4 | 0 | 8 |
| 14 | 26 | 20 | 2 | 5 | 4 | 0 | 10 |
| 15 | 26 | 20 | 8 | 5 | 10 | 2 | 10 |
| 16 | 26 | 15 | 5 | 3 | 7 | 1 | 10 |

EXAMPLES 17 TO 22

Several cleaning compositions were prepared by mixing 26 g of NMP, 15 g monoethanolamine (MEA), 5 g of either diethylene glycoamine (DEGA) or diethylene glycol (DEG), 3 g of catechol (CAT), and 7 g of DI water. The same type of patterned Al technology wafer samples with "punch-through" vias as employed in the previous Examples were placed in these solutions of heated to the temperatures indicated below for 20 minutes after which they were removed, rinsed in DI water for two minutes and blown dry with nitrogen. The cleaned wafers were then evaluated for ash residue removel (0=no removal to 10=100% removal) and aluminum corrosion (0=no corrosion to 10=severe corrosion), as noted below in Table 7.

TABLE 7

| Example # | Solution containing: | Temperature (° C.) | Aluminum corrosion | Ash residue removal |
|---|---|---|---|---|
| 17 | DEGA | 65 | 0 | 3 |
| 18 | DEGA | 75 | 0 | 6 |
| 19 | DEGA | 85 | 1 | 9 |
| 20 | DEG | 65 | 0 | 6 |
| 21 | DEG | 75 | 0 | 8 |
| 22 | DEG | 85 | 0 | 10 |

EXAMPLES 23 TO 25

Several cleaning compositions were prepared by mixing 1-methyl-2-pyrrolidinone (NMP), monoethanolamine (MEA), diethylene glycol (DEG), catechol (CAT), and DI water in the amounts shown below. The same type of patterned Al technology wafer samples with "punch-through" vias as employed in the previous Examples were placed in these solutions of heated to 65° C. for 20 minutes after which they were removed, rinsed in DI water for two minutes and blown dry with nitrogen. The cleaned wafers were then evaluated for ash residue removal (0=no removal to 10=100% removal) and aluminum corrosion (0=no corrosion to 10=severe corrosion), as noted below in Table 8.

TABLE 8

| Example # | NMP | MEA | DEG | Catechol | H₂O | Aluminum corrosion | Ash residue removal |
|---|---|---|---|---|---|---|---|
| 23 | 46 | 21 | 13 | 7 | 13 | 0 | 10 |
| 24 | 46 | 25 | 9 | 7 | 13 | 2 | 10 |
| 25 | 54 | 21 | 9 | 3 | 13 | 1 | 10 |

EXAMPLES 26-29

Several cleaning compositions were prepared by mixing 46 g of a solvent selected from the following: 1-methyl-2-pyrrolidinone (NMP), N,N-dimethylacetamide (DMAC), or dimethylsulfoxide (DMSO), 23 g of monoethanolamine (MEA) or 1-amino-2-propanol (AMP); 11 g of diethylene glycol (DEG), 5 g of catechol (CAT), and 15 g of DI water. The same type of patterned Al technology wafer samples with "punch-through" vias as employed in the previous Examples were placed in these solutions of heated to 65° C. for 20 minutes after which they were removed, rinsed in DI water for two minutes and blown dry with nitrogen. The cleaned wafers were then evaluated for ash residue removal (0=no removal to 10=100% removal) and aluminum corrosion (0=no corrosion to 10=severe corrosion), as noted below in Table 9.

TABLE 9

| Example # | | | | | | Aluminum corrosion | Ash residue removal |
|---|---|---|---|---|---|---|---|
| 26 | NMP | MEA | DEG | catechol | H₂O | 0 | 10 |
| 27 | NMP | AMP | DEG | catechol | H₂O | 0 | 8 |
| 28 | DMAC | MEA | DEG | catechol | H₂O | 2 | 10 |
| 29 | DMSO | MEA | DEG | catechol | H₂O | 1 | 9 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A stripping and cleaning composition for cleaning microelectronics substrates, the composition consisting of:
    about 20 to about 80 wt % of the composition of N-methyl pyrrolidone, monoethanolamine in an amount of from about 10% to about 45% based on the weight of the composition, from about 5% to about 15% by weight of the composition of diethylene glycol as a metal removing compound, catechol in an amount sufficient to neutralize from about 3% to about 75% by weight of the monoethanolamine such that the stripping composition has an aqueous pH of from about 9.6 to about 10.9, and water.

2. A composition according to claim 1 wherein the composition has from about 0.5 to about 10 wt % of catechol, and from about 0.5 to about 50 wt % of water.

3. A method for cleaning microelectronic substrates without producing any substantial metal corrosion, the substrate containing at least one of photoresist polymeric material, etch residues and metal residues, the process comprising contacting the substrate with a cleaning composition for a time sufficient to clean the substrate, wherein the cleaning composition consists of:
    from about 20 to about 80 wt % of the composition of N-methyl pyrrolidone, monoethanolamine in an amount of from about 10% to about 45% based on the weight of the composition, from about 5% to about 15% by weight of the composition of diethylene glycol as a metal removing compound, catechol in an amount sufficient to neutralize from about 3% to about 75% by weight of the monoethanolamine such that the stripping composition has an aqueous pH of from about 9.6 to about 10.9, and water.

4. A method according to claim 3 wherein the composition has from about 0.5 to about 10 wt % of catechol, and from about 0.5 to about 50 wt % of water.

5. A method according to claim 3 wherein the substrate comprises an aluminum metallized substrate having vias and containing metal residue.

6. A method according to claim 5 wherein the metal residue is at least one layer selected from the group consisting of titanium and titanium nitride layers.

* * * * *